United States Patent [19]

Jones

[11] Patent Number: 5,477,146
[45] Date of Patent: Dec. 19, 1995

[54] NMR ADJUSTABLE VOLUME ARRAY

[75] Inventor: Randall W. Jones, Elkhorn, Nebr.

[73] Assignee: Board of Regents - Univ of NE, Lincoln, Nebr.

[21] Appl. No.: 199,053

[22] Filed: Feb. 22, 1994

[51] Int. Cl.$^6$ ........................................... G01V 3/00
[52] U.S. Cl. .......................... 324/318; 128/653.5
[58] Field of Search ..................... 324/318, 322; 128/653.5, 653.2

[56]  References Cited

U.S. PATENT DOCUMENTS

| | | | |
|---|---|---|---|
| 4,766,383 | 8/1988 | Fox et al. | 324/318 |
| 4,825,162 | 4/1989 | Roemer et al. | 324/318 |
| 5,057,777 | 10/1991 | Kurczewski | 324/318 |
| 5,196,796 | 3/1993 | Misic et al. | 324/322 |
| 5,261,403 | 11/1993 | Saito et al. | 324/318 |
| 5,274,332 | 12/1993 | Jaskolski et al. | 324/318 |
| 5,307,806 | 5/1994 | Jones | 128/653.5 |
| 5,361,765 | 11/1994 | Herlihy et al. | 128/653.5 |
| 5,390,672 | 2/1995 | Jones | 128/653.5 |

*Primary Examiner*—Louis M. Arana
*Attorney, Agent, or Firm*—Zarley, McKee, Thomte, Voorhees & Sease; Mark D. Frederiksen

[57] ABSTRACT

A NMR abdominal coil array includes four critically overlapped resonant loops fixed upon a generally "C-shaped" (curved) coil form with an anterior housing pivotally connected and supported by a posterior form. Three of the loops are fixed to an anterior housing which is curved from a generally horizontal upper end to a generally vertical lower end, and pivotally connected to a generally vertically oriented flange forming the upper end of the posterior housing. This upper end of the posterior housing contains the remaining resonant loop. The anterior housing is pivotally connected to the posterior housing about a single horizontal axis, permitting both slight adjustment for patient size, and substantial movement for entry and exit of a patient.

13 Claims, 4 Drawing Sheets

NMR ADJUSTABLE VOLUME ARRAY

TECHNICAL FIELD

The present invention relates generally to magnetic resonance imaging (MRI) and more particularly to local coils for use in receiving MRI signals.

BACKGROUND OF THE INVENTION

A. Magnetic Resonance Imaging

Magnetic resonance imaging (MRI) refers generally to a form of clinical imaging based upon the principles of nuclear magnetic resonance (NMR). Any nucleus which possesses a magnetic moment will attempt to align itself with the direction of a magnetic field, the quantum alignment being dependent, among other things, upon the strength of the magnetic field and the magnetic moment. In MRI, a uniform magnetic field $B_0$ is applied to an object to be imaged; hence creating a net alignment of the object's nuclei possessing magnetic moments. If the static field $B_0$ is designated as aligned with the z axis of a Cartesian coordinate system, the origin of which is approximately centered within the imaged object, the nuclei which posses magnetic moments precess about the z-axis at their Larmor frequencies according to their gyromagnetic ratio and the strength of the magnetic field.

Water, because of its relative abundance in biological tissues and its relatively strong net magnetic moment $M_z$ created when placed within a strong magnetic field, is of principle concern in MR imaging. Subjecting human tissues to a uniform magnetic field will create such a net magnetic moment from the typically random order of nuclear precession about the z-axis. In a MR imaging sequence, a radio frequency (RF) excitation signal, centered at the Larmor frequency, irradiates the tissue with a vector polarization which is orthogonal to the polarization of $B_0$. Continuing our Cartesian coordinate example, the static field is labeled $B_z$ while the perpendicular excitation field $B_1$ is labeled $B_{xy}$. $B_{xy}$ is of sufficient amplitude and duration in time, or of sufficient power to nutate (or tip) the net magnetic moment into the transverse (x-y) plane giving rise to $M_{xy}$. This transverse magnetic moment begins to collapse and re-align with the static magnetic field immediately after termination of the excitation field $B_1$. Energy gained during the excitation cycle is lost by the nuclei as they re-align themselves with $B_0$ during the collapse of the rotating transverse magnetic moment $M_{xy}$.

The energy is propagated as an electromagnetic wave which induces a sinusoidal signal voltage across discontinuities in closed-loop receiving coils. This represents the NMR signal which is sensed by the RF coil and recorded by the MRI system. A slice image is derived from the reconstruction of these spatially-encoded signals using well known digital image processing techniques.

B. Local Coils and Arrays

The diagnostic quality or resolution of the image is dependent, in part, upon the sensitivity and homogeneity of the receiving coil to the weak NMR signal. RF coils, described as "local coils" may be described as resonant antennas, in part, because of their property of signal sensitivity being inversely related to the distance from the source. For this reason, it is important to place the coils as close to the anatomical region-of-interest (ROI) as possible.

Whereas "whole body" MRI scanners are sufficiently large to receive and image any portion of the entire human body, local coils am smaller and therefore electromagnetically couple to less tissue. Coupling to less tissue gives rise to coupling to less "noise" or unwanted biologically or thermally generated random signals which superimpose upon the desired MR signal. The local coils may be of higher quality factor (Q) than the body coils due to their smaller size. For all of these reasons, local coils typically yield a higher signal-to-noise (S/N) ratio than that obtainable using the larger whole body antenna. The larger antenna is commonly used to produce the highly homogenous or uniform excitation field throughout the ROI, whereas the local coil is placed near the immediate area of interest to receive the NMR signal. The importance of accurate positioning leads to the development of local coils which conform to the anatomy of interest, yet function to permit ease of use.

While the smaller local coil's size works to an advantage in obtaining a higher S/N ratio, this reduced size also presents a disadvantage for imaging deep-seated tissues. Typically, the single- conductor coil diameter which yields the optimal S/N ratio at a depth 'd' is a coil of diameter 'd'; hence, larger diameter single-conductor coils are required to image regions in the abdomen and chest of human patients. This increased coil size results in less than desirable performance, both in terms of S/N ratio and homogeneity of the sensitivity profile (which effects the uniform brightness of the image), and offers little advantage over the body coil of the system.

The S/N ratio of the NMR signal may be further increased within a region by digitally adding the post processed signals derived from two or more coils; each sensitive to the precessing nuclei within a common volume. If two coils' signals are processed and converted into image data separately and then added digitally, one can obtain an increase in S/N ratio within the common volume without the use of a signal combiner. Separate amplifiers, analog-to-digital converters, and image processor channels represent an alternative configuration for processing two signals in lieu of a single combiner circuit and processing channel. Such a system of four channels whose signals are derived from an array of four coils is described in U.S. Pat. No. 4,825,162. In the '162 patent, an array of coils is described wherein the adjacent coils overlap to prevent nearest neighbor interaction (inductive coupling). The interaction between the next nearest neighbor is supposedly reduced by connection of each coil of the array to low input impedance preamplifiers.

The problem with this solution is, among other things, the use of preamplifiers with low input impedance. This additional circuitry is costly and adds another set of possible failure modes into the system. This preamplifier circuitry is sensitive to coil impedance changes resulting from patient loading variations as well as to noise spikes or power surges within the receiver chain.

One can minimize the effects of next-nearest-neighbor interaction if one properly utilizes the formulation, in the following arguments, to minimize inductive coupling between all resonant structures. In this case, the additional preamplifier circuitry is no longer required. First, nearest—neighbor or adjacent coil interaction is a much more dominant coupling than the next-nearest-neighbor coupling—usually one or two orders of magnitude larger depending upon coil size and spacing. Second, if near-neighbor coupling has not been sufficiently minimized, then next-nearest neighbor coupling will occur via neighbor-to-neighbor interaction as strongly as, or stronger than inductive coupling between next-nearest-neighbors. Third, next-nearest neighbor interaction (inductive coupling) is further reduced towards zero when the next-nearest-neighbor coils are dominantly loaded by coupling to patient tissues. Such is the case in mid to high field scanners operating above 20 MHz. The coil's impedance is also dominated resulting from coupling to eddy current loops generated within the patient tissues. This is predicted from the mutual impedance formulation $$Z_{1d} = Z_{11} + \frac{I_2}{I_1} Z_{12}$$

where $Z_{1d}$ is the driving or output impedance of coil 1, $Z_{11}$ is the self-impedance of coil 1, $(I_2/I_1)$ is the ratio of induced eddy currents (loop 2) to the current in coil 1, and $Z_{12}$ is the mutual impedance between the loops which is equal to the radian frequency times the mutual inductance between said loops.

The implication from the above three facts is as follows. If one ensures consistent and dominant loading of the coil elements and if one ensures that near-neighbor coupling has been minimized (that inductive isolation has been achieved) and if the antenna element size, geometrical orientation, and spacing is designed so as to minimize next-nearest neighbor coupling, then the array will work properaly with little degrading interaction amongst the elements.

Inductive isolation is achieved by geometrically orienting two coil conductors such that their mutual inductance is minimized according to the following:

$$M = \frac{\mu}{4\pi} \oint \frac{I_1(\overline{dl_1}) \cdot I_2(\overline{dl_2})}{|(\overline{r_1}) - (\overline{r_2})|}$$

where M represents the mutual inductance between coils 1 and 2 and the vector components $dl_1$ and $dl_2$ represent segments of coils 1 and 2 with current amplitudes $I_1$ and $I_2$. The denominator represents the magnitude difference of the position vectors of each dl segment. The condition wherein M is approximately zero with respect to the individual self inductances of coils 1 and 2, is known as geometric isolation between the coils. This is a special case of inductive isolation but is restrictive in application, as discussed below.

As the coil geometries are sufficiently large or close to the surrounding system conductors (antenna, faraday screen, cryostat tubing, etc.) in addition to the biological conducting medium, this coupling formula must be extended to include $M = M_{12} + M_{13} + M_{23}$; where the first term is as described above, and the latter two terms define the coupling resulting from each coil's coupling to eddy current loops (loop 3) generated on or within the surrounding conductors (system or biological). These additional coupling terms must be accounted for in the adjustment of conductor geometries with respect to each other spatially. With these terms taken into account, the proper critical spacing may be found between coil loops 1 and 2.

An additional problem is not fully addressed by the prior art: this is the challenge to optimize image quality from deep seated tissues which cannot practically be surrounded by a coil conductor geometry of any appreciably reduced size in comparison to the existing body coil. This tissue geometry therefore warrants some type of surface coil configuration. An example of this would be the region of the chest or abdomen. Due to physical size limitations of the magnetic resonance imaging system bore, there is no room available to place a typical patient into an inner cylindrical volume coil such as the birdcage design of U.S. Pat. Nos. 4,680,548 and 4,692,705.

The early quadrature coil patent (U.S. Pat. No. 4,866,387) addressed the geometric isolation problem between two resonant structures but did not address the practical issues of implementation: signal combination without destruction of individual coil tuning; optimization of coil sensitivity to deep-seated tissues; and maximization of coil efficiency through minimization of coil effective volume. Quadrature signal combination cannot be accomplished without either suppressing shunt RF currents which exist through paths through the combiner circuitry, or re-tuning each coil element to compensate for the shunt current's detuning effects. Often the latter is not possible, and when it is, any frequency shift due to loading variations from patient to patient render this solution useless and quadrature performance is not achieved.

Coil efficiency is the magnetic field per unit current (upon the conductor) and provides an indication as to the ability to resolve small signals from a noisy environment. The effective volume of the coil is a calculated ratio of the coil's total region-of-sensitivity (ROS) (volume in which the coil can distinguish signal from noise) divided by its largest efficiency value within the center of the coil (not directly adjacent to any conductor). The resulting numeric value is useful for optimizing the coil geometry with respect to sensitivity from the region of interest. Sensitivity is improved with coupling to fewer noise sources, and the body represents a large volume of biologically created noise sources; therefore, if the coil is designed to couple to less tissue where signal is not desired, and its magnetic field profile is focused on tissues where signal is desired (optimal effective volume), then a sensitivity and efficiency performance will be realized.

Phased array coils such as described in U.S. Pat. Nos. 4,825,162 and 5,198,768 also do not address the problem of obtaining the optimal image quality from deep-seated tissues as discussed above. Both patents focus on obtaining a larger ROS using a bank of coils whose signals input to separate preamplifiers and digital reconstruction ports on a computer. Neither patent addresses the need for designing each coil configuration for the purpose of overlapping each coil's ROS within the desired deep seated volume and optimizing each with respect to performance within that region as discussed above. The aforementioned prior art teaches linear coil array technology—overlapping coils which extend the ROS to a larger region with the performance of a smaller coil within the entire region.

Finally, the prior art is reliant upon geometric isolation and/or low impedance preamps with no compensation for eddy current-induced coupling, and restricts that geometry to a planar surface only. The prior art also does not address imaging within a common volume by utilizing an array of coils connected to a set of separate receiver channels. This restriction is due to the fact that the prior art is dependent upon geometric isolation only, and this alone is inadequate to ensure sufficient isolation between non-adjacent pairs of non-planar conductors.

The prior art also does not address the design complexities of imaging within a common volume which varies in size or girth using coil array technology.

SUMMARY OF THE INVENTION

It is an object of the present invention to provide an improved NMR local coil designed to conform to a patient's torso within the geometric restriction of the surrounding system bore, and place multiple antenna conductors within close proximity to the entirety of said anatomy.

Another object is to provide an antenna geometry which is operable to permit ease of positioning on or about the patient anatomy, and ease of patient entry and exit.

Still another object is to provide a set of non-planar coil conductors which closely couple their regions of sensitivity to a patient's torso without detuning each individual resonator due to coupling between said resonators.

Another object of the present invention is to provide improved electronic configurations of coil conductors which yield a higher signal-to-noise ratio and improved homogeneity (of sensitivity profiles) within a deep-seated volume of interest.

A further object is to provide a co-located coil set which will interface with either a multiple-channel receiver system or a single-channel receiver system and yield an improved S/N ratio within a common volume of interest which can vary in size or girth.

These, and other objects, will be apparent to those skilled in the art.

The NMR abdominal coil array of the present invention includes four critically overlapped resonant loops fixed upon a generally "C-shaped" (curved) coil form with an anterior housing pivotally connected and supported by a posterior form. Three of the loops are fixed to an anterior housing which is curved from a generally horizontal upper end to a generally vertical lower end, and pivotally connected to a generally vertically oriented flange forming the upper end of the posterior housing. This upper end of the posterior housing contains the remaining resonant loop. The anterior housing is pivotally connected to the posterior housing about a single horizontal axis, permitting both slight adjustment for patient size, and substantial movement for entry and exit of a patient.

The three loops comprising the anterior conductor set provide imaging coverage laterally across the torso of the patient as well as along one side. The fourth loop is positioned such that inductive isolation is effectively maintained throughout the adjustment range of the pivotal anterior housing and coils.

An alternate configuration of electronically operating the same four loops is to connect alternating or non-adjacent pairs in Helmholtz-style configurations. This configuration operates whereby the two capacitively connected loops resonate at a frequency where strong magnetic flux coupling occurs between the pair of coils. This configuration is known amongst those skilled in the art as being useful for imaging more deep-seated tissues. Due to the geometric placement of the four loops, configuring the two Helmholtz-style pairs creates two vector magnetic field sensitivities orthogonal to each other within the common volume; hence creating a quadrature antenna set.

The coil housing facilitates close coupling of all four resonators to the desired anatomical location whereby all resonators contribute to the total signal collection from deep-seated tissues. The hinged opening allows adjustment to ensure nearly constant spacing between the coil conductors and the patient; hence constant coil loading, impedance matching, and therefore performance. This criteria is typically easy to achieve with linear arrays and single coil elements.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

DESCRIPTION OF THE PREFERRED EMBODIMENTS

Figure 1:
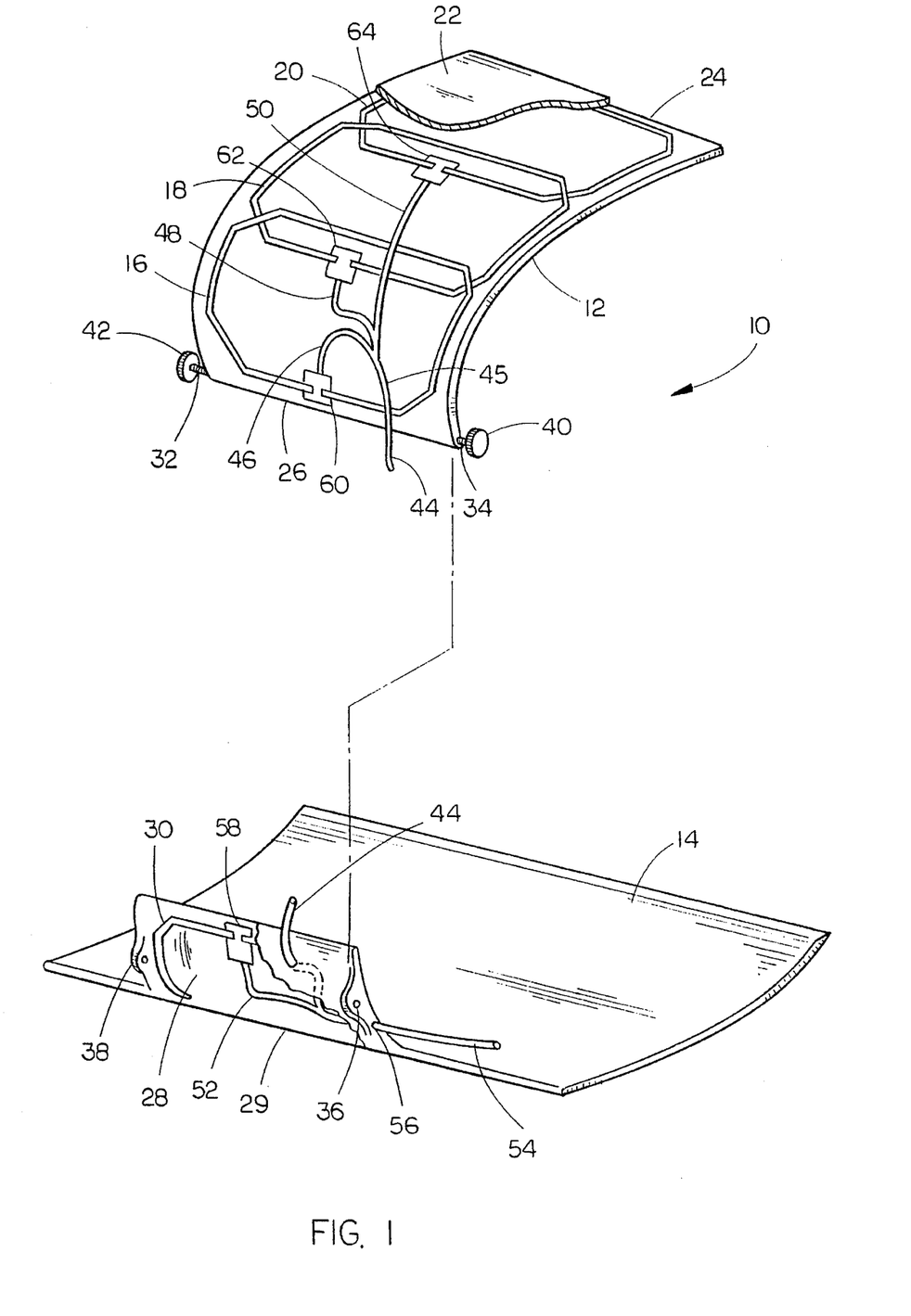
FIG. 1 is an exploded perspective view of the NMR adjustable volume array of the present invention, with conductor profiles superimposed thereon.

Referring now to the drawings, in which similar or corresponding parts are identified with the same reference numeral, and more particularly to FIG. 1, the NMR adjustable volume array of the present invention is designated generally at 10 and includes an upper anterior segment 12 operably mechanically connected to an opposed lower posterior segment 14.

Anterior segment 12 includes a plurality of electronic NMR coils 16, 18, and 20 enclosed within a durable plastic housing 22 (shown cut-away on the top side). Housing 22 extends from a generally horizontal position at upper end 24 to a generally vertical position at lower end 26, when anterior segment 12 is in the operable position (A) shown in FIG. 2.

Lower end 26 of housing 22 projects downwardly generally parallel to the generally upwardly extended flange 28 of the posterior segment 14. Flange 28 includes an electronic NMR coil conductor 30 which serves as the fourth of the array of four conductors. Conductor 30 is enclosed within a durable plastic housing 29 (shown cut-away on the bottom side). Lower end 26 of housing 22 is formed to cream an overlap between conductors 16 and 30, and serve as part of a hinge assembly 32, 34, 36, and 38 between the anterior and posterior segments, 12 and 14 respectively.

Hinge pins 32 and 34 consist of threaded brass bolts which pass through openings 36 and 38 formed in brackets on flange 28, where they may be tightened or loosened by threaded, knurled-handled nut assemblies 40 and 42. This facilitates locking the anterior segment 12 at various angles with respect to posterior segment 14 to accommodate various sizes of patients lying on the posterior segment 14 with the anterior segment 12 adjusted closely above the patient's abdomen or chest.

An electrical cable assembly 44 extends out from housing 29 from the flange 28, and enters housing 22 in the lower end 26 through a hole 45. The NMR signals from coils 16, 18, and 20 are transmitted via miniature coaxial conductors 46, 48, and 50 (respectively) which are bundled together (but electrically insulated from one another) within cable assembly 44. These cables are then bundled with coil 30's transmission line, cable 52, within housing 29, to form a larger cable bundle assembly 54 which passes out of coil housing 29 via port hole 56. Cable assembly 54 serves to carry the NMR signals from all coil elements to their respective preamplifier circuitry (within the NMR system), and also carry the direct current source signals from the NMR system to the respective coil elements to activate their recoupling circuitry located on electronic circuit boards 58, 60, 62, and 64.

Figure 3:
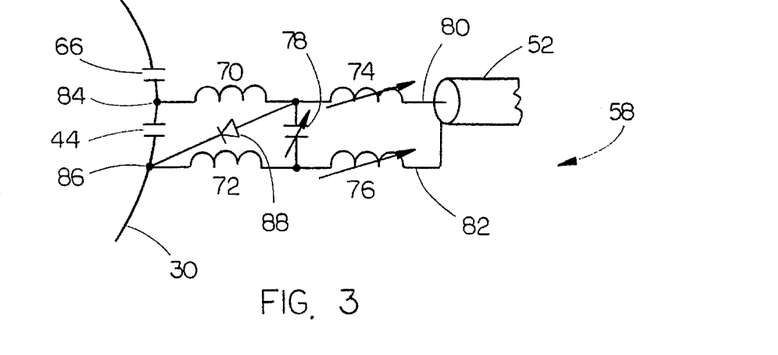
FIG. 3 is an electrical schematic of the decoupling and impedance matching boards.

Referring now to FIG. 3, the electrical schematic of circuit board 58 is shown. Since the component scheme is identical to that of boards 60, 62, and 64, only circuit board 58 will be discribed in detail. Series capacitors 66 and 68 are sized to appropriately resonate the coil loop 30. This series configuration reduces the total impedance across the capacitor 68 which must be impedance matched to the 50 ohm transmission line 52. Inductors 70, 72, 74, and 76 and capacitor 78 form a "modified Tee" impedance matching network which matches the complex impedance developed across capacitor 68 to the 50 ohm transmission line 52. Inductors 70 and 74 are series connected between capacitors 66 and 68 and one conductor 80 of transmission line 52. Inductors 72 and 76 are series connected between the opposite side of capacitor 68 and a second conductor 82 of transmission line 52. One terminal of capacitor 78 is connected between inductors 70 and 74, while the other terminal of capacitor 78 is connected between inductors 72 and 76, to form the "modified Tee". Whereas inductors 70 and 74 in conjunction with capacitor 78 would be the "standard Tee" configuration, the additional inductors 72 and 76 modify the standard Tee and serve two purposes. First, they are designed to be approximately equal in inductance to inductors 70 and 74; hence creating a balanced-to-unbalanced impedance transformer ("balun" to those versed in radio frequency (RF) electronics). Second, dividing the total circuit inductance evenly onto both conductors 80 and 82 of the transmission line 52 also keeps both nodes 84 and 86 above earth ground so as to prevent establishment of an RF ground within the sensitive receiver system. Such an RF ground can produce undesirable effects upon the magnetic field homogeneity within the NMR system.

Diode 88 is connected at one end between inductors 70 and 74, and at the other end to node 86, and serves as a decoupling diode which is activated by system-provided direct current (DC)—voltage pulses. During the transmit mode of the MRI data acquisition cycle, a DC voltage forward biases diode 88 into a conduction state; hence, effectively placing inductor 70 in parallel with capacitor 68. Together these components create a high impedance circuit to the RF currents induced upon the resonant coil structure, loop 30, thereby decoupling the coil loop from the transmit antenna power.

Figure 4:
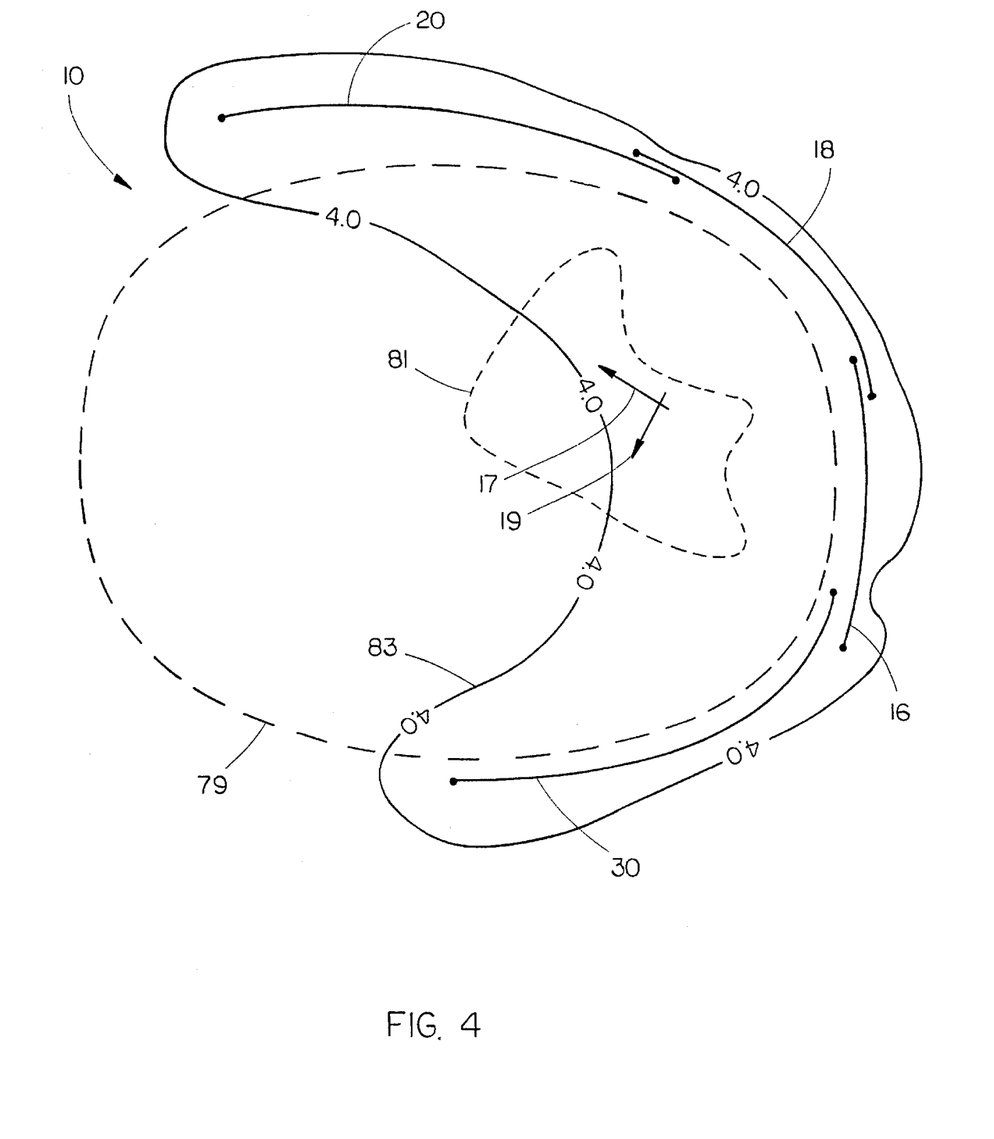
FIG. 4 is a diagram of the coil elements in relation to the human torso and with the corresponding regions of optimal quadrature detection and uniformity of fields superimposed.

Referring now to FIG. 4, the simplified conductor diagram of the coil elements 16, 18, 20 and 30, demonstrates that a critical overlap exists between the conductors such that they operate in conjunction with one another in the manner described below.

Each coil is inductively isolated from the adjacent coil via minimization of total mutual inductance M which includes the inductance between two adjacent coils $M_{12}$ and the inductance between each of these coils and a third eddy current loop (loop 3— terms $M_{13}$ and $M_{23}$) which is created by the induction of currents upon adjacent conducting materials such as; the RF screen (not shown)—surrounding the entire assembly 10, or biological medium 79.

Referring once again to FIG. 2, the coils 16, 18, 20, and 30 (whose conductors are shown in position on the axial slice of the coil geometry) have been sized such that their region(s)-of-sensitivity (shown in dashed lines) penetrate well into the patient 11 but not through the patient where a significant mutual coupling would exist between non-adjacent pairs of resonant loops. Note that the iso-flux (magnetic field strength per unit current (H/I)) contours 21a, 19a, 17a, and 31a, associated with coil elements 20, 18, 16, and 30 respectively, do overlap within the central region of the patient 11, but with a H/I value (0.5) significantly reduced from the H/I values (4.5) 21b, 19b, 17b, and 31b obtainable proximal to the coil conductors. Optimization of coil elemental size has been accomplished using the above-mentioned computational algorithms so that all coil elements receive MRI signal from deep-seated tissues and yet couple minimally to one another. Signal from all coil elements are digitally sampled and added in the MRI system signal processor. Also, the distance separating the non-adjacent coil loops as well as the direction of induced currents serve to minimize coupling between the four loops in this invention. This is important for achieving the maximum performance from each coil element in terms of that element remaining impedance matched at, and tuned to, the proper frequency as discussed in detail in conjunction with FIG. 5, herein below.

Figure 2:
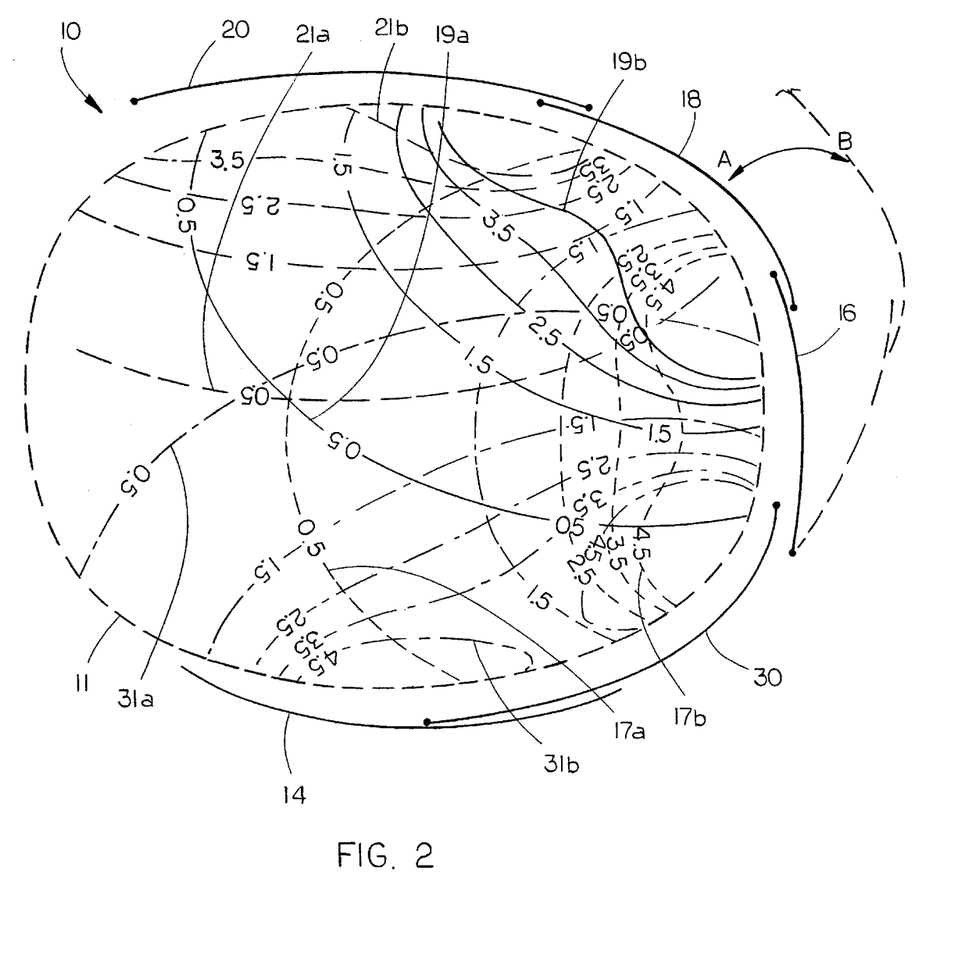
FIG. 2 is a side elevational schematic view taken from the right side of FIG. 1 with the resulting magnetic flux isocontours of each coil element (shown in the fully closed operational position) superimposed thereon.

Continuing with FIG. 2, the patient load (resistance coupled into the coil circuit via mutual impedance between the coil and current loops within the patient) remains relatively constant in this invention due to the hinged anterior segment 12. Anterior segment 12 houses coil elements 16, 18, and 20 and adjusts to maintain a relatively fixed distance from the patient 11 over a broad range of patient sizes. As the patient load is the dominant source of coil loading at the coil frequencies of which this coil set is operating, maintaining the fixed patient load permits limited adjustment of the coil positions relative to one another without destroying the inductive isolation which was sought in the original design concept.

Motion of coil 16 with respect to coil 30 is restricted such that mutual inductance between coils 16 and 30 remains close to zero. The small variation of mutual inductance from null is so slight that the resulting frequency shift of coils 16 and 30 also remains small. In the instance where the mutual inductance M does not equal zero, the resulting frequencies are $$f = \frac{1}{2\pi \sqrt{(L \pm M)C}}$$

where L and C represent the total coil inductance and capacitance of each loop.

Figure 5:
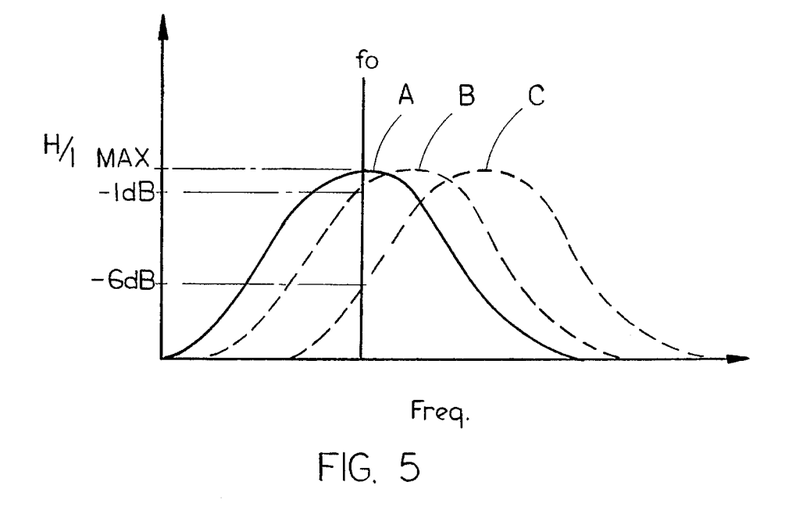
FIG. 5 is a graph of frequency response curves of co-located coils.

Referring now to FIG. 5, the frequency response of a coil is represented by the coil sensitivity (H/I) plotted with respect to frequency. Frequency response curve A represents a single coil loop response with peak sensitivity at the initial resonance $f_o$.

An acceptable frequency shift due to non-zero mutual inductance is represented by trace B. At this shift the H/I is only decreased by 1 dB from maximum. This translates to a visually imperceptible change in image brightness in a processed MR image. Comparatively, a larger frequency shift such as represented by curve C results in a signal degradation of 6 dB which translates to one quarter of the signal intensity of the originally tuned coil.

Optimizing the coil sizes with respect to desired magnetic field sensitivity penetration, minimizing inductive coupling by accounting for eddy current loops as well as adjacent coil loops, and maintaining the dominant coil loading during exams of a variety of patient sizes are the procedural essence of this invention.

Figure 6:
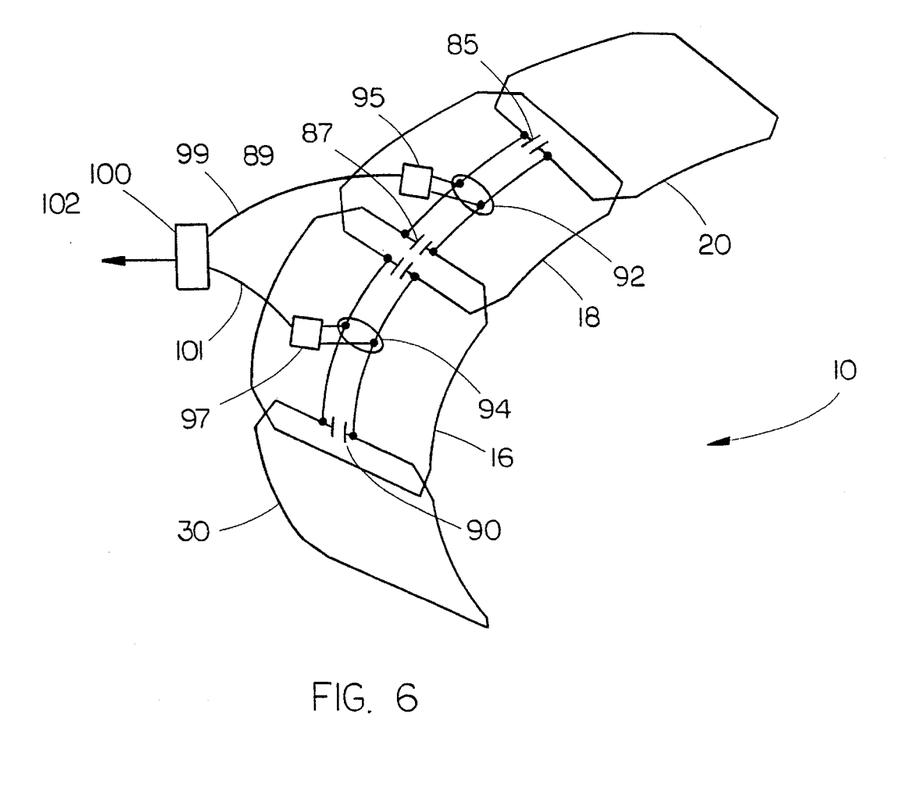
FIG. 6 is a perspective view of the conductors and electrical connections of a second embodiment of the NMR adjustable volume array.

Referring now to FIG. 6, a second embodiment of the NMR adjustable volume array relies upon the electrical connection of coils 16, 18, 20, and 30. Non-adjacent coils 16, 20 and 18, 30 are paired such that a common magnetic flux linkage is created between the two coils of each pair. Junction capacitors 85, 87, 89, and 90 of the four coils are part of the total distributed capacitance of each coil loop 20, 16, 18, and 30 respectively.

Coil 20 is capacitively connected to non-adjacent coil 16 via a conductor pair 92 which connects one terminal of capacitor 85 to the respective terminal of capacitor 87. Opposite terminals of capacitors 85 and 87 are also connected via the remaining conductor of the conductor pair 92. This connection ensures a commonly directed current flow in each of the proximal conducting rods 96 and 98 of coils 20 and 16 respectively hence ensuring a common magnetic flux linkage between coils 20 and 16. This is similar to that which exists in a Helmholtz configuration of two coil loops such as familiar to those learned in the art.

Similarly, coils 18 and 30 are connected across capacitors 89 and 90 with conductor pair 94 creating a common magnetic flux linkage.

Referring again to FIG. 4, the common magnetic flux vector direction created with the patient imaging volume by coil pair 16 and 20 is depicted by vector 17 while vector 19 represents that flux linkage between coils 18 and 30. These vectors are generally perpendicular to each other thereby ensuring magnetic isolation between the two pairs of coils. The contour 81 indicates the region of optimal quadrature gain resulting from orthogonality and amplitude equality of vectors 17 and 19. Quadrature gain within this contral region contributes to the larger region of uniformity 83. Note that is is the combination of signal strength, which decays as the inverse of the distance squared from the coil conductors, and quadrature gain which yields this uniform region of sensitivity 83.

Referring again to FIG. 6, NMR signals generated across the capacitor pairs 85-87 and 89-90 are then either combined via a quadrature combiner circuit 100 with the resulting signal transmitted via a single transmission line 102, or the two signals may feed into separate receiver channel preamplifier circuits as discussed in the first embodiment. Each signal generated across the above mentioned capacitor pairs is impedance matched using lumped element matching circuit boards 95 and 97 and transmitted to the combiner 100 (as shown) via short lengths of coaxial cable 99 and 101, or after impedance matching the cables 99 and 101 are extended to the system preamplifier connector.

Whereas the invention has been shown and described in connection with the preferred embodiments thereof, it will be understood that many modifications, substitutions and additions may be made which are within the intended broad scope of the appended claims. There has therefore been shown and described an improved NMR local coil which accomplishes at least all of the above stated objects.

I claim:

1. A NMR adjustable volume array, comprising:

an anterior housing supporting an anterior coil set, having opposing forward and rearward ends, an upper end and a lower end;

said anterior housing curved from a generally vertically oriented lower end to a generally horizontally oriented upper end when the anterior housing is in a working position;

said anterior coil set including a plurality of NMR coils maintained in fixed positions relative to one another within said housing, and following the curvature of said anterior housing;

a posterior housing supporting a posterior NMR coil, having opposing forward and rearward edges, an upper end and a lower end, operably and pivotally connected along its upper end to said anterior housing lower end such that said anterior housing is pivotable within a predetermined pivot range;

said posterior housing curved upwardly from a generally horizontally oriented lower end to a generally vertically oriented upper end;

said anterior and posterior housings forming a generally C-shaped housing assembly; a posterior NMR coil within said posterior housing and following the curvature of said housing from the upper end towards the lower end; and said anterior coil set and posterior coil electrically connected to NMR imaging apparatus and operable throughout the pivot range of said anterior housing.

2. The array of claim 1, wherein said anterior NMR coils includes an upper coil extending from the anterior housing upper end towards the anterior housing lower end, and a lower coil extending from the anterior housing lower end towards the anterior housing upper end, and wherein said posterior and anterior coils each have a region of sensitivity extending generally radially from each said coil inwardly towards the general center of said C-shaped housing assembly.

3. The array of claim 2, further comprising means for pivotally connecting said anterior and posterior housings so as to maintain relative inductive isolation between the anterior lower coil and the posterior coil.

4. The array of claim 3, wherein each said coil is a loop antenna having an upper end and a lower end, and wherein relative inductive isolation between the anterior lower coil and the posterior coil is maintained by pivotally connecting the anterior and posterior housing with the lower end of the anterior lower coil overlapping the upper end of the posterior coil such that the posterior coil upper end projects upwardly beyond the lower end of the anterior lower coil a predetermined distance and such that the anterior housing is pivoted generally about the lower end of the anterior lower coil.

5. The array of claim 4, wherein said anterior coils include an intermediate NMR coil located substantially between said upper and lower anterior coils, and wherein said anterior coils are located so as to maintain relative inductive isolation.

6. The coil array of claim 1, wherein said anterior coil set includes an upper, an intermediate and a lower anterior coil, and further comprising:

means for electrically connecting said upper and lower anterior coils to operate as a first coil pair; and means for electrically connecting said intermediate anterior coil and said posterior coil to operate as a second coil pair.

7. The coil array of claim 6, wherein said coils are sized and located relative to one another so as to minimize inductive coupling between said first and second coil pairs.

8. The coil array of claim 7, wherein said coils of said first coil pair are located relative to one another, and said coils of said second coil pair are located relative to one another, to minimize inductive coupling between said first and second coil pairs.

9. The coil array of claim 8, wherein said first coil pair is located relative to the second coil pair to minimize inductive coupling therebetween.

10. The coil array of claim 9, wherein each said first and second coil pairs have a magnetic field vector, and wherein said first and second coil pairs are located to orient said vectors orthogonally.

11. The coil array of claim 6, further comprising means for electrically connecting the coils of said first coil pair to create a Helmholtz pair, and means for electrically connecting the coils of said second coil pair to create a second Helmholtz pair.

12. The coil array of claim 6, wherein each said coil pair detects precessing magnetic moment in tissue produced by NMR imaging apparatus and transmits a signal in response thereto, and wherein said electrical connection to the NMR imaging apparatus further comprises independent transmission lines connected between each coil pair and independent receiver preamplifiers in said NMR imaging apparatus.

13. The coil array of claim 6, wherein each said coil pair detects precessing magnetic moment in tissue produced by NMR imaging apparatus and transmits a signal in response thereto, wherein said electrical connection to the NMR imaging apparatus further comprises:

independent transmission lines connected between each coil pair and a combiner means for combining said signals in quadrature; and a single transmission line connected between said combiner means and a single receiver preamplifier in the NMR imaging apparatus.

* * * * *